United States Patent
Bae et al.

(10) Patent No.: US 6,236,604 B1
(45) Date of Patent: May 22, 2001

(54) ROW ADDRESS CIRCUIT OF SEMICONDUCTOR MEMORY DEVICE AND ROW ADDRESSING METHOD IN REFRESH MODE

(75) Inventors: Il Man Bae, Suwon; Sang Pyo Hong, Seoul, both of (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/496,943

(22) Filed: Feb. 3, 2000

(30) Foreign Application Priority Data

Aug. 10, 1999 (KR) .................................................. 99-32718

(51) Int. Cl.$^7$ ....................................................... G11C 7/00
(52) U.S. Cl. ............................ 365/203; 365/222; 365/233
(58) Field of Search ................................... 365/233, 222, 365/203, 230.06, 236, 194

(56) References Cited

U.S. PATENT DOCUMENTS 5,430,680 * 7/1995 Parris ................................... 365/222
5,978,297 * 11/1999 Ingalls ................................ 365/225.7
5,999,481 * 12/1999 Cowles et al. ....................... 365/233

* cited by examiner

Primary Examiner—Vu A. Le
Assistant Examiner—Hien Nguyen
(74) Attorney, Agent, or Firm—Skjerven Morrill MacPherson LLP; David W. Heid

(57) ABSTRACT

A row address circuit of a semiconductor memory device includes a signal generator that generates a pulse in an enable signal for an output circuit that provides a decoded address. The pulse has a first edge that is delayed relative to a corresponding first edge of a refresh count signal and a second edge that precedes a corresponding second edge of the count signal. Accordingly, the enable signal prevents changes in the output signal that could otherwise result from input of an external address during a refresh operation. Therefore, the present invention can prevent an invalid address by cutting off a predecoder before a transition of a refresh count signal to prohibit a change of a predecoded output.

10 Claims, 3 Drawing Sheets

ROW ADDRESS CIRCUIT OF SEMICONDUCTOR MEMORY DEVICE AND ROW ADDRESSING METHOD IN REFRESH MODE

BACKGROUND OF THE INVENTION

1. Field of the Invention

The present invention relates to a row address circuit of a semiconductor memory device such as a DRAM and to row addressing in a refresh mode of the DRAM.

2. Description of Related Art

Generally, a semiconductor memory device such as a DRAM stores data as electric charge in isolated cell capacitors. However, leakage current from a capacitor can change the charge and destroy the stored data. Accordingly, DRAMs require periodic refresh operations that read and rewrite the stored data and thereby refresh the charge stored on the cell capacitors. Refresh operations are thus very important in a DRAM. Current DRAMs commonly adopt a CAS-Before-RAS automatic refresh method. With this refresh method, a refresh address counter built into a DRAM chip generates a row address, and the DRAM does not require an externally generated refresh address. When operating in the refresh mode, the DRAM uses the internally generated row addresses and disables use of externally input addresses. There are two common methods for disabling use of the externally generated address. One method operates a transfer gate of an address input circuit to cut off the input of an external address when a refresh count signal is in an active state. The other method disables changes in the output of a predecoder to prevent the output of a predecoded row address from changing based on the externally input address when the refresh count signal is inactive.

Conventionally, a semiconductor device uses a row address setup signal as a control signal of a transfer gate in the input stage of a predecoder. The row address setup signal enables and disables input of an external row address in a normal operating mode of the DRAM.

In the refresh mode, a delayed refresh count signal enables and disables input of the refresh row address from the counter. The delayed refresh count signal is commonly delayed to match the timing of the row address setup signal. Accordingly, immediately after a transition of the refresh count signal, an external address can change the row address before the delayed refresh count signal disables the transfer gates. This allows the predecoded row address signal to change with the result that two word lines are enabled or an invalid address is generated.

SUMMARY OF THE INVENTION

In accordance with an aspect of the present invention, a row address circuit of a semiconductor memory device and a row addressing method used in the row address circuit prevent an invalid address from arising in a refresh mode. More specifically, the row address circuit cuts off changes in an output signal of a predecoder before a corresponding transition of a refresh count signal might allow a change of the output signal.

A semiconductor device according to one embodiment of the present invention includes a refresh address counter, an input circuit, a predecoder, a signal generator, an output generator, and a precharge circuit. The refresh address counter changes a refresh address signal in response to a leading edge of an active region of a refresh count signal. The input circuit selectively inputs an external signal in normal mode or the refresh address signal in a refresh mode. The predecoder inputs and predecodes the row address signal from the input circuit in response to a row address setup signal in the normal mode and in response to a delayed refresh count signal in the refresh mode. The signal generator produces an enable signal having a leading edge delayed relative to a leading edge of an active region of the refresh count signal and a trailing edge before a trailing edge of the active region of the refresh count signal. The signal generator generates the enable signal in response to the refresh count signal in the refresh mode. The output generator can change the predecoded row address signal during the active region of the enable signal. The precharge circuit precharges an input edge of the predecoder in response to a trailing edge of the enable signal.

An addressing method according to the present invention includes: generating a refresh address signal in response to a trailing edge of an active region of a refresh count signal; opening an input passage for the refresh address signal and cutting off an input passage of an external address signal at the trailing edge of the active region of the refresh count signal; predecoding the refresh row address signal in response to a delayed refresh count signal; generating an enable signal having a leading edge delayed relative to a leading edge of the active region of the refresh count signal and a trailing edge occurring before the trailing edge of the active region of the refresh count signal; outputting the predecoded row address signal in response to a leading edge of the enable signal; and precharging an input stage of the predecoder in response to a trailing edge of the enable signal.

Further aspects and advantage of the invention can be more fully understood from the following detailed description taken in conjunction with the accompanying drawings.

DETAILED DESCRIPTION OF THE INVENTION

Figure 1:
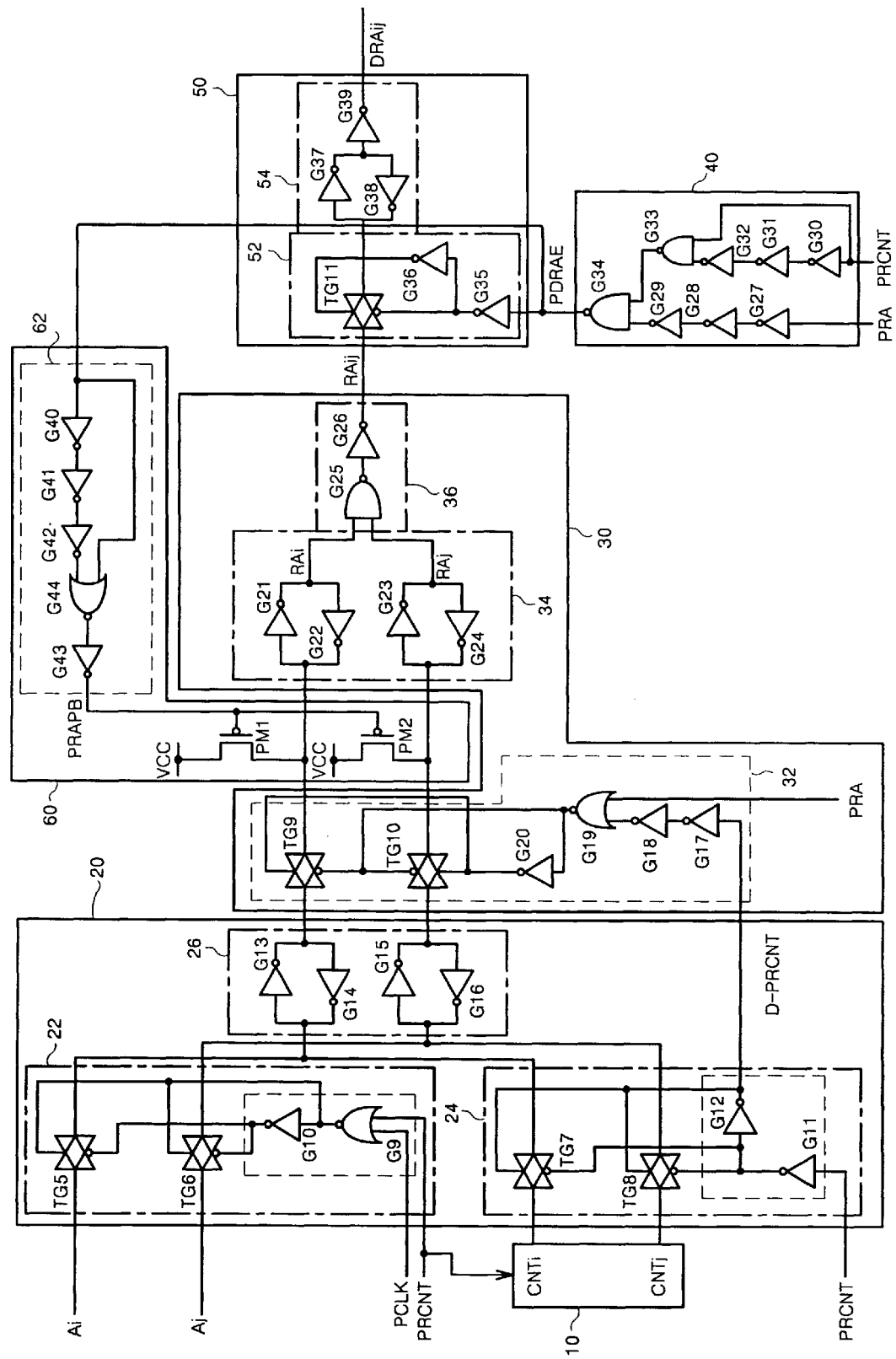
FIG. 1 is a circuit diagram of a row address circuit of a semiconductor memory device according to an embodiment of the present invention.

FIG. 1 illustrates an address circuit 100 in accordance with an exemplary embodiment of the present invention. In the normal mode, the address circuit 100 decodes address bits Ai and Aj to determine whether address bits Ai and Aj correspond to a word line associated with the address circuit 100. A semiconductor memory such as a DRAM uses four address circuits similar or identical to the address circuit 100 for four associated word lines. Each of the four address circuits has a unique combination of two input address signal selected from a set including bits Ai and Aj and their complements /Ai and /Aj. FIG. 1 illustrates the example where the combination includes bits Ai and Aj.

The address circuit 100 includes a refresh address counter 10, an input circuit 20, a predecoder 30, an enable signal generator 40, an output circuit 50, and a precharging circuit 60. The refresh address counter 10 provides bits CNTi and CNTj as refresh address signals for the address circuit 100, when operating in a refresh mode. In particular, a trailing edge, e.g., a high-to-low transition, of an active region of a refresh count signal PRCNT causes the counter 10 to change refresh address bit CNTi. The counter 10 generates refresh address bits CNTi and CNTj and their complements /CNTi and /CNTj, and each of four address circuits similar to the address circuit 100 uses a unique combination of two of the four bits CNTi, CNTj, /CNTi, and /CNTj.

Figure 2:
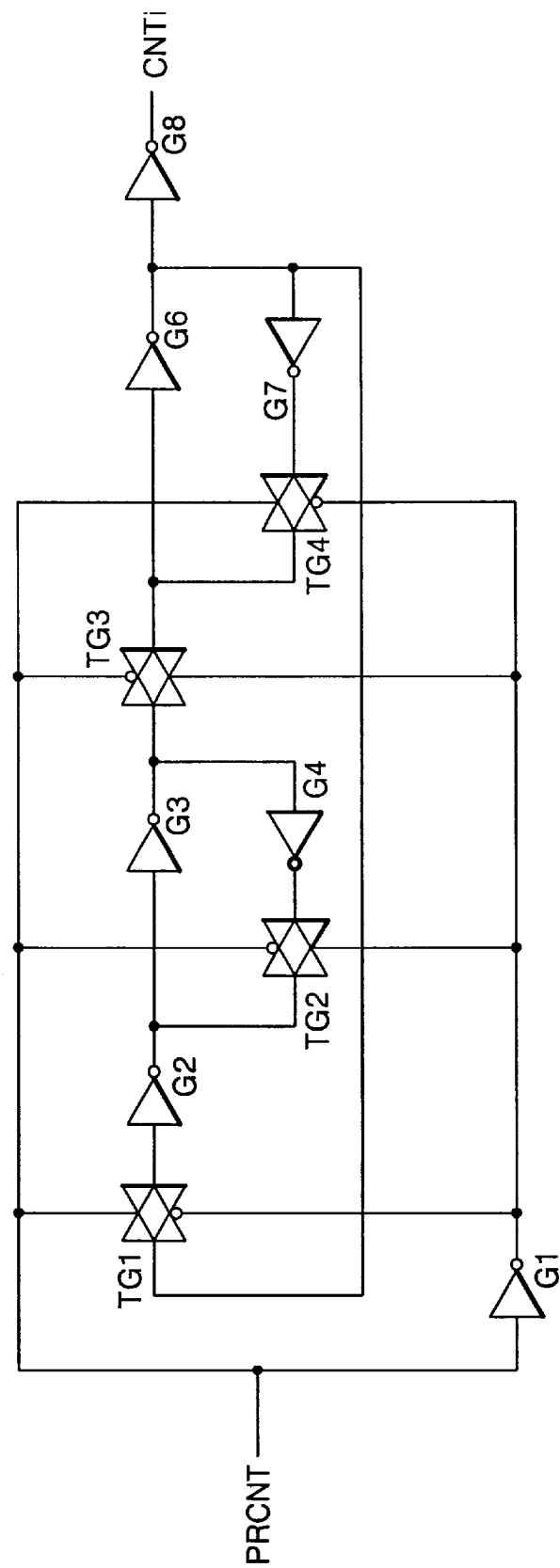
FIG. 2 is a circuit diagram of a unit cell in a refresh counter shown in FIG. 1.

FIG. 2 shows a stage of the counter 10 for generation of refresh count bit CNTi. In the exemplary embodiment, the refresh address counter 10 includes two similar stages, one for each refresh address bit CNTi and CNTj. The illustrated stage of the refresh address counter 10 includes a pair of latches 210 and 220 formed from transfer gates TG1 to TG4 and inverters G1 to G8. When the refresh count signal PRCNT transitions from high to low, the latch circuit 210 latches a prior value of inverted refresh address bit /CNTi from the latch circuit 220. More specifically, the transfer gate TG2 turns on, the transfer gate TG1 turns off, and the inverters G3 and G4 hold the output signal from the latch 210 at a steady level equal to the previous level of signal /CNTi. The latch circuit 220 is transparent when signal PRCT is low. Accordingly, refresh address bit CNTi changes in response to each high-to-low transition in refresh count signal PRCNT.

When the refresh count signal PRCNT transits to a high level, the latch circuit 220 latches and maintains the voltage level of output signal CNTi. More specifically, the transfer gate TG4 turns on, the transfer gate TG3 turns off, and the inverters G6, G7, and G8 hold the signals /CNTi and CNTi at steady levels. Accordingly, signal CNTi toggles with a frequency that is one half the frequency of refresh count signal PRCNT. In the stage having refresh address bit CNTj as an output signal, signal CNTi replaces signal PRCNT as the input so that signal CNTj toggles at one half the frequency of signal CNTi.

The input circuit 20 (FIG. 1) respectively transmits external address signals Ai and Aj in the normal mode and the refresh address signals CNTi and CNTj in the refresh mode. In the normal mode, signal PRCNT remains at a low voltage. In the refresh mode, signal PRCNT toggles between the high and low voltages.

The input circuit 20 includes a first switch 22, a second switch 24, and a first storage circuit 26. The first switch 22 includes transfer gates TG5 and TG6, a NOR gate G9, and an inverter G10. In the normal mode, the first switch 22 passes externally input address signals Ai and Aj to the storage circuit 26. More specifically, in the normal mode, the transfer gates TG5 and TG6 pass respective signals Ai and Aj in response to an internal clock signal PCLK when the refresh count signal PRCNT is low. When the refresh count signal PRCNT is high, the transfer gates TG5 and TG6 are off and disable the input of the external address signals Ai and Aj.

The second switch 24 includes transfer gates TG7 and TG8 and inverters G11 and G12 and controls input of refresh address signals CNTi and CNTj from the refresh address counter 10. When the refresh count signal PRCNT is low, the transfer gates TG7 and TG8 are off to disable the input of the refresh address signals CNTi and CNTj. When the refresh count signal PRCNT is high, the transfer gates TG7 and TG8 are on and pass the refresh address signals CNTi and CNTj to the first storage circuit 26.

The first storage circuit 26 includes a first latch circuit formed from inverters G13 and G14 and a second latch circuit formed from inverters G15 and G16. Each latch circuit latches a respective address signal from the first or second switch 22 or 24.

The predecoder 30 includes a third switch 32, a second storage circuit 34, and a decoder 36. The third switch 32 inputs the row address signal from the input circuit 20 when a delayed refresh count signal D-PRCNT or a row address setup signal PRA is high. The storage circuit 34 latches the input signals that the switch 32 passes, and the decoder 36 generates a predecoded signal RAij by decoding row address signals RAi and RAj from the storage circuit 34.

The third switch 32 includes transfer gates TG9 and TG10, inverters G17, G18, and G20, and a NOR gate G19. In the normal mode, the delayed count signal D-PRCNT remains low, and the third switch 32 switches the transfer gates TG9 and TG10 in response to the row address setup signal PRA. The storage circuit 34 then latches the address signals from the input circuit 20 and passes those address signals to the decoder 36. In the refresh mode, signal PRCNT toggles between the high and low voltage states, and transfer gates TG9 and TG10 respond to the delayed refresh count signal D-PRCNT to match the timing of the row address setup signal PRA. The switch 32 passes the address signals from the input circuit 20 through the storage circuit 34 into the decoder 36.

The second storage circuit 34 includes a latch circuit formed from inverters G21 and G22 and a latch circuit formed from inverters G23 and G24. The latch circuits provide respective row address signals RAi and RAj from the third switch 32 to the decoder 36.

The decoder 36 includes an input NAND gate G25 and an inverter G26, and generates an AND predecoded row address signal RAij. In particular, the address circuit 100 corresponds to a word line for which both address bits Ai and Aj or CNTi and CNTj are one, and asserts signal RAij high when both address signals RAi and RAj are high.

The signal generator 40 includes a first delay including series-connected inverters G27, G28, and G29, a second delay including series-connected inverters G30, G31, and G32, first combining logic including a NAND gate G33, and second combining logic including a NAND gate G34. The signal generator 40 responds to the row address setup signal PRA and the refresh count signal PRCNT and generates an enable signal PDRAE. In the normal mode, signal PRCNT remains low, and the signal generator 40 generates the enable signal PDRAE in response to the row address setup signal PRA. In the refresh mode, the refresh count PRCNT toggles, and the signal generator 40 asserts signal PDRAE in response to the refresh count signal PRCNT. More particularly, in the refresh mode, the signal generator 40 generates a pulse in the enable signal PDRAE for a pulse duration W1 beginning at a rising edge of the refresh count signal PRCNT. The pulse duration W1 corresponds to the delay time of the inverters G30, G31, and G32. An active region of the pulse has a leading edge delayed by a first predetermined time t1 from the rising edge of the refresh count signal PRCNT.

The output circuit 50 includes: the fourth switch 52 including a transfer gate TG11 and inverters G35 and G36; and an output latch 54 including inverters G37, G38, and G39. The output circuit 50 latches the predecoded row address signal Raij in response to the enable signal PDRAE, and outputs a decoded row address signal DRAij. The decoded row address signal DRAij is provided to a corresponding word line through a main decoder.

The precharging circuit 60 includes PMOS transistors PM1 and PM2 and a signal generator 62. The signal generator 62 includes inverters G40, G41, and G43 and a NOR gate G44. The precharging circuit 60 precharges an input stage of the storage circuit 34 of the predecoder 30 with a power supply voltage VCC. More specifically, the signal generator 62 generates a pulse in the precharge signal PRAPB, which is applied to gates of PMOS transistors PM1 and PM2, in response to the trailing edge of the active region of the enable signal PDRAE. The pulse has a duration W2 corresponding to the delay time of the inverters G40, G41, and G42. The precharge levels drive predecoded signal RAij to the low voltage, but only after the enable signal PDRAE turns off the switch 52, preventing changes in signal DRAij.

Figure 3:
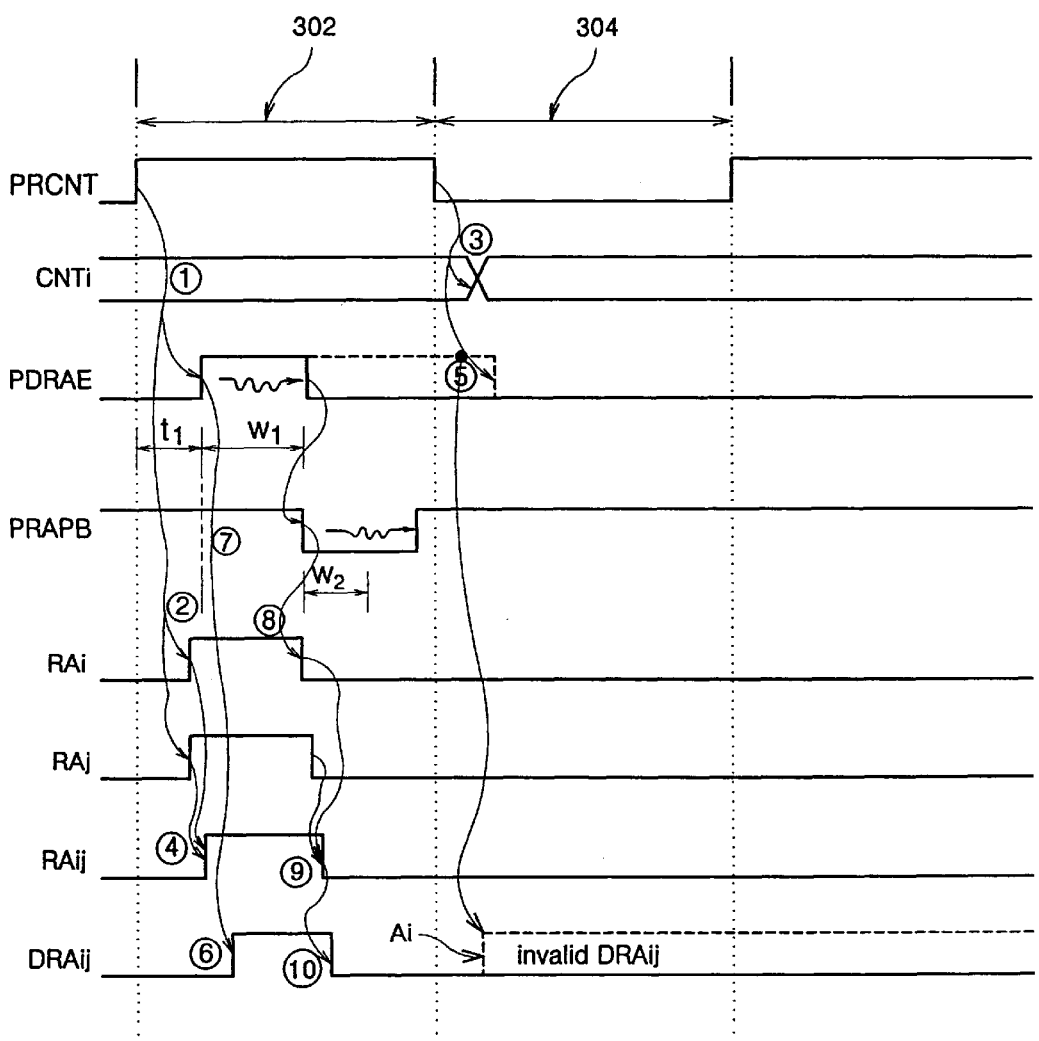
FIG. 3 is a timing chart illustrating the timing of signals in a row address circuit of FIG. 1.

FIG. 3 shows the timing of signals in the address circuit 100 of FIG. 1 during operation in the refresh mode. In FIG. 3, the refresh count signal PRCNT has an active region 302 and a precharge region 304 with a duty ratio of 50%. The counter 10 changes the count value CNTi when the refresh count signal PRCNT transits to the low level, for example at transition ③ in FIG. 3. A low-to-high transition ① in refresh count signal PRCNT indicates that a refresh address from the counter 10 should be decoded. In response to the corresponding transition in the delayed count signal D-PRCNT, the latch circuit 34 of the predecoder 30 latches count values CNTi and CNTj as the row address signals RAi and RAj. Next, the decoder 36 AND-processes ④ the latched row address signals RAi and RAj to generate the predecoded signal RAij.

The signal generator 40 delays a leading edge of the enable signal PDRAE by a predetermined time t1 in response to the rising edge ① of the refresh count signal PRCNT. Accordingly, the output circuit 50 can change ⑥ decoded output signal DRAij when address enable signal PDRAE turns on the fourth switch 52. Thereby, the switch 52 transmits the predecoded signal RAij to the latch circuit 54, which outputs the decoded row address signal DRAij. The latch circuit 54 latches the decoded row address signal DRAij when enable signal PDRAE transits ⑦ from high to low voltage.

When the precharge signal PRAPB transits to a low level in response to the high-to-low transition ⑦ of the enable signal PDRAE, the precharge circuit 60 turns on PMOS transistors PM1 and PM2 and charges an input stage of the latch circuit 34 with a power supply voltage VCC. The row address signals RAi and RAj then transit ⑧ to a low level. Consequently, the predecoded signal RAij also transits ⑨ to a low level. The predecoded signal DRAij can next change ⑩ to the low state when enable signal PDRAE next transitions to the high state.

In response to the leading edge of the active region of the refresh count signal PRCNT, the enable signal PDRAE stays active during the pulse duration W1. The pulse duration W1 is such that enable signal PDRAE drops back to the low voltage state before the trailing edge of the active region of refresh count signal PRCNT.

In contrast to the address circuit 100, a conventional address circuit has an enable signal that transits from low to high and from high to low directly in response to the corresponding transition in the refresh count signal PRCNT. For example, the dotted line for signal PDRAE in FIG. 3 represent a conventional enable signals performance where the high-to-low transition ⑤ is in response to the high-to-low transition ③ of the refresh count signal PRCNT. The delay between transitions ③ and ⑤ causes the third and fourth switches 32 and 52 to remain on even after the refresh count signal PRCNT falls to the low state. Consequently, the third and fourth switches 32 and 52 input and transmit the external signals Ai and Aj to the output circuit 50 from the first switch 22, and generation of an invalid decoded row address signal DRAij is possible.

According to an aspect of the present invention, the enable signal PDRAE falls to the low state before the high-to-low transition of the refresh count signal PRCNT. Accordingly, the fourth switch 52 is off and prevents the input of an invalid address to the latch circuit 54 so as to prevent use of an invalid row address signal.

Although the invention has been described with reference to particular embodiments, the description is only an example of the invention's application and should not be taken as a limitation. For example, the above-described embodiments employ signals having particular transition such as high-to-low transitions or low-to-high transitions corresponding to leading and trailing edges of the active region of a signal. Such signals could alternatively employ a complementary convention to those described above. Various other adaptations and combinations of features of the embodiments disclosed are within the scope of the invention as defined by the following claims.

What is claimed is:

1. A row address circuit of a semiconductor memory device, comprising:
   a refresh address counter that generates a refresh address signal in response to a refresh count signal;
   an input circuit that selectively inputs the refresh address signal in a refresh mode and an external address signal in a normal mode;
   a predecoder that receives an address signal from the input circuit;
   a signal generator that produces an enable signal including a active region with a leading edge delayed relative to a leading edge of an active region of the refresh count signal and a trailing edge prior to a trailing edge of the active region of the refresh count signal, the signal generator generating the active region in the enable signal in response to the refresh count signal in the refresh mode; and
   an output circuit that outputs the predecoded row address signal, wherein the active region of the enable signal enables the output circuit to change the predecoded row address signal.

2. The row address circuit of claim 1, wherein the predecoder receives the address signal from the input circuit in response to a row address setup signal in the normal mode and in response to a delayed refresh count signal in the refresh mode.

3. The row address circuit of claim 2, wherein the signal generator comprises:
   a first delay for delaying the row address setup signal;
   a second delay for delaying the refresh count signal;
   first combining logic that combines a signal delayed from the second delay and the refresh count signal to generate an auto pulse signal having an active duration according to a delay time of the second delay; and
   second combining logic that combines an output signal of the first delay and the auto pulse signal to generate the enable signal.

4. The row address circuit of claim 3, wherein the first and the second delays respectively comprise inverters connected in series.

5. The row address circuit of claim 3, wherein each of the first and the second combining logic comprises a NAND gate.

6. The row address circuit of claim 1, further comprising a precharging circuit that precharges an input stage of the predecoder in response to a trailing edge of the enable signal.

7. The row address circuit of claim 1, wherein the semiconductor device is a synchronous DRAM.

8. A row address circuit comprising:
- a first transfer gate that switches a path of a pair of external address signals in response to a refresh count signal or an internal clock signal;
- a refresh address counter that generates a pair of refresh address signals in response to the refresh count signal;
- a second transfer gate that switches a pair of the refresh address signals in response to the refresh count signal;
- a first latch for latching a pair of address signals provided through the first and second transfer gates;
- a third transfer gate for switching a pair of output signals of the first latch in response to a row address setup signal or a delayed refresh count signal;
- a second latch for latching a pair of row address signals provided through the third transfer gate;
- a precharging circuit that precharges the second latch in response to a row address precharge signal;
- a row address decoder that decodes a pair of row address signals from the second latch to generate a decoded row address signal;
- a fourth transfer gate that switches the decoded row address signal in response to an enable signal;
- a third latch for latching the decoded row address signal provided through the fourth transfer gate;
- a first signal generator that generates the enable signal, wherein in a refresh mode, a pulse in the enable signal has a leading edge delayed relative to a leading edge of the refresh count signal and a trailing edge prior to a trailing edge of the refresh count signal, while the first signal generator generates the pulse in the enable signal in response to the row address setup signal or the refresh count signal; and
- a second signal generator that generates a precharge signal, the precharge signal having a predetermined active region generated in response to a trailing edge of the enable signal.

9. A row address circuit of a semiconductor memory device, comprising:
- a first switch that cuts off external signals in response to an active region of a refresh count signal in a refresh mode, and that passes the external signals in a normal mode;
- a refresh address generator that produces a refresh address signal in response to the refresh count signal in the refresh mode;
- a second switch that passes the refresh address signal during the active region of the refresh count signal in the refresh mode;
- a first storage circuit for storing an address signal provided through the first and the second switches;
- a third switch for switching an output signal of the first storage circuit in the normal mode and in the refresh mode;
- a second storage circuit for storing a row address signal provided through the third switch;
- a precharging circuit that precharges the row address signal, being connected to an input edge of the second storage circuit;
- a row address decoder for decoding the row address signal stored in the second storage circuit;
- a fourth switch that switches the decoded row address signal in response to a row address enable signal in the normal and refresh modes;
- a third storage circuit for storing the decoded row address signal provided through the fourth switch;
- a first signal generator that produces an enable signal having a trailing edge prior to a trailing edge of the active region of the refresh count signal, the first signal generator generating a pulse in the row address enable signal in response to the row address setup signal or the refresh count signal; and
- a second signal generator that produces a precharge signal having a predetermined active region in response to a trailing edge of the enable signal to control the precharging circuit.

10. A row addressing method comprising:
- generating a refresh address signal in response to a refresh count signal;
- inputting the refresh row address signal by opening an input path of the refresh address signal and cutting off an input path of an external address signal at an edge of the refresh count signal;
- predecoding the input refresh row address signal in response to a delayed refresh count signal;
- generating an enable signal having a leading edge delayed relative to a leading edge of the refresh count signal and a trailing edge prior to a trailing edge of the refresh count signal;
- outputting the predecoded row address signal in response to the leading edge of the enable signal;
- precharging an input stage of the predecoder in response to the trailing edge of the enable signal.

* * * * *